United States Patent [19]

Auda

[11] Patent Number: 4,814,041

[45] Date of Patent: Mar. 21, 1989

[54] METHOD OF FORMING A VIA-HOLE HAVING A DESIRED SLOPE IN A PHOTORESIST MASKED COMPOSITE INSULATING LAYER

[75] Inventor: Bernard Auda, Montlhery, France

[73] Assignee: International Business Machines Corporation, Armonk, N.Y.

[21] Appl. No.: 99,856

[22] Filed: Sep. 22, 1987

[30] Foreign Application Priority Data

Oct. 8, 1986 [EP]  European Pat. Off. ........ 86430035.5

[51] Int. Cl.$^4$ ........................................... H01L 21/308
[52] U.S. Cl. .................................. 156/643; 156/644; 156/646; 156/653; 156/657; 156/659.1; 430/316; 430/317; 430/323; 437/947; 437/981
[58] Field of Search ............... 156/643, 644, 646, 652, 156/653, 655, 657, 659.1, 663, 668; 430/316, 317, 323; 437/947, 978, 981

[56] References Cited

U.S. PATENT DOCUMENTS

| | | | |
|---|---|---|---|
| 4,461,672 | 7/1984 | Musser | 156/644 |
| 4,487,652 | 12/1984 | Almgren | 156/643 |
| 4,522,681 | 6/1985 | Gorowitz et al. | 156/643 |
| 4,631,248 | 12/1986 | Pasch | 430/313 |
| 4,676,869 | 6/1987 | Lee et al. | 156/643 |

FOREIGN PATENT DOCUMENTS

| | | | |
|---|---|---|---|
| 57-100731 | 6/1982 | Japan | 437/947 |
| 61-91929 | 5/1986 | Japan | 156/643 |

OTHER PUBLICATIONS

Ashby, "Doping Level Selective Photochemical Dry Etching of GaAs", Appl. Phys. Lett. 46(8) 752-54.

Ashby et al, "Composition-Selective Photochemical Etching of Compound Semiconductors", Appl. Phys. Lett. 47(1) 62-63.

IBM Technical Disclosure Bulletin, vol. 27, No. 6, Nov. 1984, pp. 3259-3260.

IBM Technical Disclosure Bulletin, vol. 28, No. 7, Dec. 1985, pp. 3136-3137.

*Primary Examiner*—David L. Lacey
*Assistant Examiner*—Andrew J. Anderson
*Attorney, Agent, or Firm*—Ira D. Blecker

[57] ABSTRACT

In a dry etching equipment, a variable gas mixture composition provides etch and ash simultaneously. For example, when a $SiO_2$/phospho silicate glass composite insulating layer with a respective thickness of about 300 and 600 nm masked by a patterned photoresist layer is to be etched, a $CHF_3/O_2$ gas mixture may be used with the following steps:

1. Dry etching the composite insulating layer in an RIE equipment by a plasma action in a gas mixture containing a fluorine compound and an oxidizer with a percentage of the oxidizer of about 10–20% to form a tapered hole having the desired slope in the top PSG insulating layer;
2. Dry etching the composite layer in the gas mixture with a percentage of the oxidizer in the gas mixture of about 1–8% to transfer the desired slope from the PSG insulating layer to the bottom $SiO_2$ insulating layer, wherein during this step the slope of the tapered hole in the PSG insulating layer has been modified; and then
3. Dry etching the composite layer in said gas mixture with a percentage of the oxidizer in the gas mixture of about 80–100% to adjust the slope in said top insulating layer to said desired slope.

Therefore the method is comprised of a reduced number of operations. In addition, because the process is only based on different $CHF_3/O_2$ flow ratios, no pumping is necessary, and therefore the process results in higher throughputs. The slope of the resulting via-hole is in the desired 55-65 deg. range.

6 Claims, 1 Drawing Sheet

METHOD OF FORMING A VIA-HOLE HAVING A DESIRED SLOPE IN A PHOTORESIST MASKED COMPOSITE INSULATING LAYER

FIELD OF THE INVENTION

The invention relates to dry etching techniques and more particularly to a method of forming a tapered via-hole having a desired and controlled slope in a composite insulating layer comprised of at least two dielectric materials having different etching rates such as Phospho Silicate Glass (PSG) and silicon dioxide ($SiO_2$).

BACKGROUND OF THE INVENTION

The use of photolithographic and etching steps to produce via-holes in insulating layers formed during the semiconductor wafer processing are important and critical steps in the course of the manufacturing of Very Large Scale Integration (VLSI) silicon chips. For example, via-holes may be etched through an insulating layer, and a metal layer subsequently deposited thereon, filling the via-holes and providing an elecrrical contact with the underlying conductive layer, i.e., a polysilicon land or a monocrystalline silicon substrate.

With a continuous trend towards still further integration and microminiaturization of active/passive devices, the need for methods of producing extremely small via-holes becomes more acute. Known wet etching processes fail in that respect because of capillary problems, so that the liquid etchant cannot reach the bottom of the via-holes. Therefore, it clearly appears today that dry etching processes such as Plasma Etching and Reactive Ion Etching have a greater potential to produce extremely small via-holes of a diameter equal to or less than 1 micron.

Unfortunately, when dry etching processes are used, the etching direction is substantially anisotropic, i.e. in a vertical direction only, thereby producing via-holes with substantially vertical sidewalls. As a result, step coverage problems are encountered during metallization, with the metal layer being substantially thinner on the sidewalls and the step of the via-hole than elsewhere. These metal thickness irregularities can give rise to a risk of potential cracks and cause variations in the land resistances. As a result, they may cause subsequent metal land opens which in turn, sometimes result in a total failure of the functional circuit integrated in the chip.

Accordingly, in order to prevent such cracks from occurring, the slopes of these contact openings have to be tapered, i.e. as smooth as possible (about 60 deg.) to allow a good metal coverage.

In order to minimize or preferably to eliminate these step coverage problems, efforts have been made to develop dry etching methods for producing via-holes with sloped profiles through an insulating layer formed by a single dielectric material. One method of doing this has been to suggest the use of a conventional photoresist mask which has a sloped profile.

A technique to produce tapered via-holes in a patterned photoresist mask formed on an insulating layer consists of heating the structure so that the resist softens, and because of the surface tension, develops tapered walls.

Since the mask is anisotropically eroded to some degree by the plasma gas as the underlying insulating layer is etched, the result is replication of the mask profile, more or less, in the insulating layer.

This technique suffers from the difficulty of ensuring that the etch rate ratio equals the ratio of thicknesses and also limits the profile conformal to the shape assumed by the photoresist mask during the bake step (after the development of the resist).

Another method has been to use the sensitivity of certain photoresist compositions to erosion. It has been discovered that said erosion is substantially isotropic, making it possible to produce anisotropic etching results by the use of controlled isotropic photoresist erosion during the etching process.

This process suffers from the use of non-standard photoresist compositions.

In addition, various variables such as lithographic conditions, exposure parameters, surface topography and hole size seriously affect hole profiles and dimensions to such an extent that precision control by this method and reproducible results are very difficult to obtain.

Moreover, it is frequent in the silicon chip processing, and in particular in the manufacturing of MOSFET's, to etch extremely small contact via holes over either a silicon substrate or a polysilicon land through a thick composite insulating layer comprised of at least two dielectric materials having different etching rates, e.g., a layer of Phospho Silicate Glass (PSG) overlying a layer of silicon dioxide ($SiO_2$). The problem of precision control mentioned above becomes even more acute when such a composite layer is used, because of the different etching rates of the two materials. If wet etchant is used to etch the via-hole, the openings become too large for high density circuits, because PSG etches much faster than thermally grown $SiO_2$.

A first attempt to produce via-holes with sloped profiles in a composite insulating layer, while still fully complying with dry etching techniques, has been developed by the applicant and consisted of a succession of etch (using $CHF_3$) and ash (using $O_2$) steps.

The basic principle of this technique has been published in the IBM Technical Disclosure Bulletin: "Multi-step contour etching process", Vol. 27, No. 6, November 1984, pp. 3259–3260 and "Multi-step etching of dissimilar materials achieving selectivity and slope control", Vol. 28, No. 7, December 1985, pp. 3136–3137.

For example, real experiments were conducted in the manufacturing line of a typical CFET product, in the etching of conaact via-holes through a photoresist masked PSG/$SiO_2$ composite insulating layer, to expose a portion of an underlying polysilicon layer. This process consisted of the following steps:

| No. 1 | Etching  | 3.6 min | Ashing | .4 min  |
|-------|----------|---------|--------|---------|
| No. 2 | Etching  | 3.1 min | Ashing | .6 min  |
| No. 3 | Etching  | 2.2 min | Ashing | 1.1 min |
| No. 4 | Etching  | .5 min  | Ashing | 2.2 min |
| No. 5 | Etching  | .6 min  | Ashing | 3.3 min |
| No. 6 | Etching  | .7 min  | Ashing | 1.0 min |
| No. 7 | Cleaning | 1.0 min |        |         |

This "multi-step" process has a long down time, because it implies 6 etching steps, each followed by an ashing step. Between two successive steps, long pumping sequences are necessary, to exhaust the previous gas system (e.g. $CHF_3$) before filling with the following gas system (e.g. $O_2$).

The total etch + ash time is 20.3 min. while the overall time including the pumping time is about 42.0 min. Such an overall time is a serious problem in a manufacturing line where high throughputs are desirable.

The "multistep" process is also characterized by its full anistropy. $CHF_3$ etches vertically the composite oxide layer, but the photoresist mask is not attacked, while $O_2$ does not attack the composite oxide layer but attacks the photoresist mask. The photoresist mask is attacked by $O_2$ only if its openings are tapered. This implies a requirement to cure the photoresist mask in order to reflow the resist material. As a result of the reflow, vertical sidewalls are modified in tapered sidewalls. Unfortunately the use of a cured photoresist mask is a non-desired limitation. The ashing is only used for mask erosion. The anisotropic etching of oxide has a selective etch rate ratio between resist and oxide. The above process is characterized by its vertical etching component.

So there still exists a need for a dry etching method for producing a tapered via-hole with sloped profile in a photoresist masked composite insulating layer such as a $PSG/SiO_2$ layer.

SUMMARY OF THE INVENTION

The foregoing problems are solved by a preferred embodiment of the method of the present invention.

According to the teachings of the present invention, it suggests a method of forming tapered via-holes through a photoresist masked composite insulating layer overlying a substrate to expose a portion of said substrate. Said composite insulating layer is comprised of top and bottom insulating layers which have different etch rates.

The method involves dry etching techniques using a plasma action of a gas mixture containing a fluorine compound and an oxidizer, and is comprised of the following three steps:

1. Dry etching the photoresist masked composite insulating layer in an RIE equipment by a plasma action in a gas mixture containing a fluorine compound and an oxidizer with a first percentage of the oxidizer in the gas mixture to form a tapered hole having the desired slope in the top insulating layer;

2. Dry etching the composite layer in said gas mixture with a second percentage of the oxidizer in the gas mixture, to transfer said desired slope from the top insulating layer to the bottom insulating layer, wherein during this step the slop of the tapered hole in the top insulating layer has been modified; and 3. Dry etching the composite layer in said gas mixture with a third percentage of the oxidizer in the gas mixture to adjust the slope in said top insulating layer to said desired slope.

This method, so called the "Multi-Slope" process, aims to modify the shape of the photoresist mask simultaneously with oxide etching. That is, it combines both the etching and ashing in one step.

As there are two different oxides to reach the substrate, more than one step is needed. In other words, the etching anisotropy is modified in parallel with a change in the fluorine compound and oxidizer ratio.

A preferred embodiment will be detailed hereafter using the "multislope" process of the present invention with a $CHF_3/O_2$ mixture in the same conditions as in the "multistep process" detailed above, i.e. to etch a contact via-hole through a photoresist masked $PSG/SiO_2$ composite oxide layer to expose a polysilicon land. According to that embodiment, the "multislope" process is comprised of the following steps:

| No. 1 | Etching/Ashing | 6.0 min |
| No. 2 | Etching/Ashing | 5.0 min |
| No. 3 | Etching/Ashing | 7.0 min |
| No. 4 | Cleaning | 1.0 min |

According to the "multislope" basic concept, the main differences between steps, simply consists in different flow ratios between the fluorine compound and oxidizer, i.e. the percentage of oxidizer in the gas mixture. All other parameters are less important. As a result, there is no need for pumping down between steps, and therefore the RF power may be held on. In addition, compared to the "multistep" process the etch + ash total time is reduced to 19 min, and the overall time including the pumping time is reduced to about 25 min.

Compared to the "multistep" method of dry etching an insulating layer detailed above, the "multislope" process does not require either special photoresist compositions or to cure the photoresist material to produce via-holes with tapered sidewalls.

Therefore, a primary advantage of the method of the present invention is to produce tapered via-holes with sloped profiles in a composite insulating layer with a reduced overall time compared to that obtained with a "multistep" like process.

Another advantage of the method of the present invention is to accept photoresist either after development or after curing.

Still another advantage of the method of the present invention is to be independent of the nature or composition of the photoresist material used to mask the composite inslating layer.

Furthermore, another advantage of the method of the present invention is to provide a very good slope control during via hole etching.

These and other advantages of the present invention will appear more fully upon consideration of the various illustrative embodiments which will be described in detail in connection with the accompanying drawings forming a material part of this disclosure.

DETAILED DESCRIPTION OF THE INVENTION

A wide variety of plasma gases are suitable for use according to the invention; in general, they comprise at least one fluorine compound such as trifluoromethane ($CHF_3$), tetrafluoromethane, hexafluoroethane or nitrogen trifluoride, usually in a mixture with inert gases such as helium or argon. Fluorine compounds of this type, upon conversion to the plasma state, produce excited neutral and ionized species which react with the dielectric material, e.g. PSG or $SiO_2$, to form volatile compounds, thereby etching away said llayer and producing the desired via-holes. The choice of plasma gases is also made so as to achieve controlled erosion of the photoresist mask. This is generally accomplished by incorporating at least one oxidizer in the plasma gas.

Oxygen is a preferred oxidizer by reason of this effectiveness and relative economy of use.

The equipment used to conduct the experiments is the AME 8100 Reactive Ion Etcher manufactured by Applied Materials. CHF$_3$/O$_2$ ratio was the main parameter adjusted to obtain different slopes. The etch rate ratio between the resist mask and oxide layers have been continuously varied along the three steps of the method. Influence of O$_2$ ratio in the etching process to define tapered via-holes in the insulating layer formed by a single dielectric material is admittedly known. When CHF$_3$ is used alone in RIE equipment, it provides holes with vertical walls. The addition of O$_2$ aims to obtain a sloped profile in the sidewalls of via-holes.

Figure 1A:
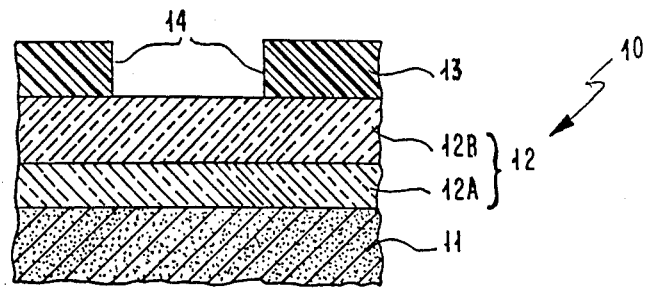
FIGS. 1A to 1D are schematic cross sectional views of the effect of the "multislope" process of the present invention on the formation of a contact via-hole through a photoresist masked $PSG/SiO_2$ composite insulating layer.

In FIG. 1A, there is shown a portion of a silicon wafer 10 having a substrate 11, e.g. a conductive polysilicon land, passivated by a composite insulating layer 12 comprised of: an underlying or bottom SiO$_2$ layer 12A and an overlying or top PSG layer 12B. For example, this underlying insulating layer of SiO$_2$ may constitute the gate oxide or the field oxide of a MOSFET transistor. Typical thicknesses are respectively 300 nm and 600 nm. A thick photoresist layer 13 (thickness about 1200 nm) is applied thereon, exposed and developed by standard techniques, so as to form a photoresist mask provided with an opening 14 and to expose a portion of the top PSG layer 12. The exposure and development are performed in the normal way, so that the edges of the photoresist mask are substantially vertical, say in the 80-85 deg. range. However, the photoresist layer 13 may also be cured to provide a tapered sidewall opening as well. It is to be emphasized that any kind of known photoresist such as AZ 1350J (a diazoquinone-sensitized novolak) manufactured by American Hoechst Corporation may be used. It is an important aspect of the method of the present invention to be photoresist independent.

In addition, according to the method of the present invention, it does not matter whether the patterned photoresist layer 13 has been cured or not to taper the opening 14. In fact, a slope of 60 deg. was achieved with cured photoresist and 65 deg. with uncured photoresist.

Figure 1B:
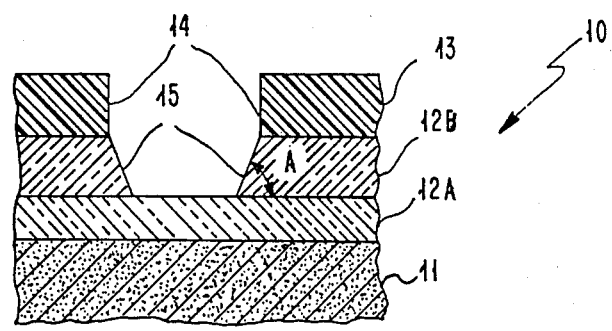

Reference is now made to FIG. 1B. It is essential to understand that SiO$_2$ has a low etch rate in CHF$_3$ compared to PSG, which etches fast in CHF$_3$.

The first step consists in plasma etching the PSG layer 12B with an O$_2$ flow of 15% of the total gas flow to produce an opening 15 with a tapered slope in the top PSG layer 12B. This step ends when the SiO$_2$ underlayer 12A, used as an etch stop layer, is reached. The degree of taper A is about 65 deg.

The etch parameters of step 1 are:

| O$_2$ Flow | 15 sccm (1) |
|---|---|
| CHF$_3$ Flow | 85 sccm |
| Pressure | 60 mTORR |
| Power | 1350 Watts |
| Time | 6 min |

(1) sccm means standard cubic centimeters per minute.

(1) sccm means standard cubic centimeters per minute.

The key parameter is of course the CHF$_3$/O$_2$ ratio which has to be about six; in other words the proportion of O$_2$ is about 15% of the mixture. All other parameters are less determinant and may vary to some extent. In general, the proportion of O$_2$ in this step should be in the range of about 10-20%.

It is to be noted that according to standard processes, the pressure is normally maintained lower than 50 mTORR, e.g. in the range of about 10-30 mTORR. So the "multislope" process of the present invention operates with unusually high pressure.

The second step with the standard SiO$_2$ etch process conditions is used for the transfer of the previous degree of taper A in the bottom SiO$_2$ layer 12A. This step preferably ends approximately 10 nm before the polysilicon land 11 is exposed (not represented). The structure of FIG. 1B is contacted with a plasma under etching conditions.

The etch parameters of step 2 are:

| O$_2$ Flow | 3 sccm |
|---|---|
| CHF$_3$ Flow | 85 sccm |
| Pressure | 70 mTORR |
| Power | 1350 Watts |
| Time | 5 min |

Because CHF$_3$ is a polymerizing gas, using it causes polymer deposition. The role of O$_2$ is to ash the polymers. It is known that SiO$_2$ etches slowly compared to PSG. During SiO$_2$ etching, the slope of the hole, referenced 15', produced in the PSG layer 12B, increases to 75 deg. or 80 deg. when uncured photoresist is used, which is not desired. This degree of taper will be corrected during step 3. During this step, the degree of taper A, has been transferred from the PSG layer to the SiO$_2$ layer, forming hole 16 in the SiO$_2$ underlying layer 12A. The CHF$_3$/O$_2$ ratio is about 28, which means that the proportion of O$_2$ in the mixture is about 3%. In general, the proportion of O$_2$ in this step should be in the range of about 1-8%.

Figure 1C:
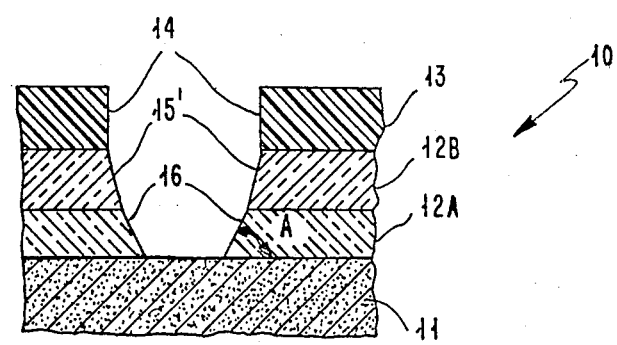

FIG. 1C shows the resulting structure and respective tapered slopes of the openings as obtained after the second step.

The third step with an O$_2$ flow of about 90% of the total flow gas, etches the resist faster than the oxides of both layers. This corresponds to a CHF$_3$/O$_2$ ratio of about 0.1. In general, the proportion of O$_2$ in this step should be in the range of about 80-100%.

During this step the remaining 100 nm of SiO$_2$ are completely removed and the top PSG layer 12B is etched again to get the desired tapered slope, while the underlying SiO$_2$ layer is etched at a low rate to conserve the same slope of about 60 deg.

Therefore, the purpose of this third step is to etch fast the resist mask, without impacting the slope of the hole in the SiO$_2$ layer 12A which is correct but significantly correcting hole sidewalls in the PSG layer 12B to reach the appropriate 60 deg. slope. The rate of erosion of the photoresist mask 13 varies directly with the proportion of O$_2$ in the plasma and controls the angle at which the via-hole in the SiO$_2$ layer is tapered.

The etch parameters of step 3 are:

| O$_2$ Flow | 80 sccm |
|---|---|
| CHF$_3$ Flow | 7 sccm |
| Pressure | 70 mTORR |
| Power | 1350 Watts |
| Time | 7 min |

Figure 1D:
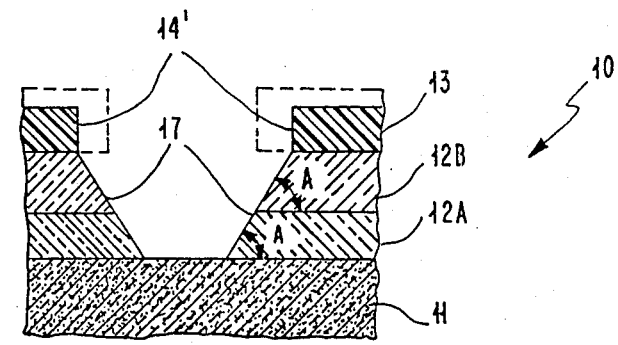

FIG. 1D shows the resulting structure after the third step. The final tapered slope A of the hole 17 produced in the composite PSG/SiO$_2$ insulating layer is about 60 deg. (in the 55/65 deg. range). At this point, the photoresist mask 13 has been substantially eroded in both vertical and horizontal direction; reference 14' shows the final opening in said photoresist mask.

All those parameters might change from one tool to another.

This method is able to achieve slopes from 50 to 60 deg. or 60 to 70 deg. depending whether the photoresist has been cured or not. This degree of taper is good enough for a continuous metal film coverage over the edge (no edge breaks). It is to be noted too, that the final structure exhibits approximately the same degree of taper for both the top and bottom insulating layers although they have significantly different etch rates.

A last, $CF_4$ cleaning step is used to achieve good contact resistance and remove contaminants.

The clean parameters of step 4 are:

| | | |
|---|---|---|
| $CF_4$ Flow | 75 | sccm |
| Pressure | 50 | mTORR |
| Power | 1350 | Watts |
| Time | 1 | min |

The above results may be summarized in the following table:

| | Mask | Top layer | Bottom layer |
|---|---|---|---|
| 1st Step | Medium E R (1) | Medium E R<br>Medium ERR<br>(2) mask/top layer | Normal E R<br>Medium ERR<br>mask/bottom layer |
| 2nd Step | Low E R | Normal E R<br>High ERR<br>top layer/mask | Normal E R<br>High ERR<br>bottom-layer/mask |
| 3rd step | High E R | Normal E R<br>Low ERR mask/<br>top layer | Low E R<br>High ERR<br>mask/bottom layer |

(1) ER = Etch Rate
(2) ERR = Etch Rate Ratio

Therefore, according to the broad principle of the present invention, if the etch rate of the top insulating layer is higher than the etch rate of the bottom one (as illustrated above in a preferred embodiment), the desired slope profile is achieved in three steps according to the following recommendations:

First step:
The etch rate of the top insulating layer to be etched and the mask erosion must be adjusted at a given etch rate ratio depending on the materials used. The partial pressure is tuned toget a horizontal component of the etching. This first etching step ends when the bottom insulating layer is reached.

Second step:
A vertical etching with high selectivity with the mask is necessary to transfer the slope of the top layer into the underlying bottom one. This second etch ends a few thousand Angstroms before the active substrate material.

Third Step:
The last etching step aims to rebuild the previous tapered slope in the top layer. This is done by etching the mask faster than the insulating layer. In this step, the top layer is etched faster than the bottom one. It allows the few remaining Angstroms to be removed before the end-etch.

The above method has been described with reference to a composite insulating layer comprised of two insulating layers: a top PSG layer overlying a bottom $SiO_2$ layer with the etching rate of the PSG material higher than the etching rate of the $SiO_2$ material. The method may be generalized to even further other situations such as different slopes, different materials, etc.

If the etch rate is the same for both insulating layers, the desired slope profile is achieved by using the same $CHF_3/O_2$ ratio and the etch rate ratio is given below depending on the value of the desired slope:
(a) Slope<45 degrees etch rate mask>etch rate layers
(b) Slope=45 degrees etch rate mask=etch rate layers
(c) Slope>45 degrees etch rate mask<etch rate layers If the etch rate of the top insulating layer is lower than the etch rate of the bottom one, the desired slope profile is still achieved in three steps according to the following recommendations:

First step:
The $CHF_3/O_2$ ratio must still be adjusted to get the desired slope in the top insulating layer.

Second step:
No change is needed during this step (slope transfer).

Third step:
Only the time has to be adjusted. The $CHF_3/O_2$ ratio has to be adjusted to control the etch rate ratio between the mask and insulating layers.

In any case, a three step process is still appropriate whatever the respective etch rates of the top and bottom insulating layers.

What is claimed is:

1. Method of forming a tapered via-hole having a desired slope in a photoresist masked composite insulating layer comprised of a bottom insulating layer overlying a substrate, and a top insulating layer overlying said bottom insulating layer, the materials of said top and bottom insulating layers having different etch rates with respect to gaseous mixtures containing a fluorine compound and an oxidizer characterized in that the method comprises the following steps of:
   (a) dry etching the composite insulatinglayer in an RIE equipment by plasma action in a gas mixture containing a fluorine compound and an oxidizer with a first percentage greater than zero percent of the oxidizer in the gas mixture to form a tapered hole having the desired slope in the top insulating layer;
   (b) dry etching the composite layer by a plasma action in said gas mixture with a second percentage of the oxidizer greater than zero percent in the gas mixture, to transfer said desired slope from the top insulating layer to the bottom insulating layer, wherein during this step the slope of the tapered hole in the second insulating layer has been modified; and
   (c) dry etching the composite layer by a plasma action in said gas mixture with a third percentage of the oxidizer greater than zero percent in the gas mixture to adjust the slope in said top insulating layer to said desired slope, while the slope in said bottom insulating layer is not significantly modified.

2. The method of claim 1 wherein the etch rate of said bottom insulating layer is lower than the etching rate of said top insulating layer.

3. The method of claim 2 wherein the material constituting said bottom insulating layer is $SiO_2$ and the material constituting said top insulating material is phospho silicate glass.

4. The method of claim 3 wherein said gas mixture is comprised of $CHF_3$ as the fluorine compound and $O_2$ as the oxidizer.

5. The method of claim 4 wherein said first, second and third percentage of $O_2$ in the gas mixture are in the 10-20%, 1-8%, and 80-100% range, respectively.

6. The method of claim 5 wherein the pressure in said RIE equipment is in the 50-80 mTORR range.

* * * * *